United States Patent
Adderly et al.

(10) Patent No.: US 9,330,988 B1
(45) Date of Patent: May 3, 2016

(54) METHOD OF FINE-TUNING PROCESS CONTROLS DURING INTEGRATED CIRCUIT CHIP MANUFACTURING BASED ON SUBSTRATE BACKSIDE ROUGHNESS

(71) Applicant: International Business Machines Corporation, Armonk, NY (US)

(72) Inventors: Shawn A. Adderly, Miami, FL (US); Kyle Babinski, Swanton, VT (US); Daniel A. Delibac, Colchester, VT (US); David A. DeMuynck, Underhill, VT (US); Shawn R. Goddard, South Burlington, VT (US); Matthew D. Moon, Jeffersonville, VT (US); Melissa J. Roma, Bend, OR (US); Craig E. Schneider, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/580,283

(22) Filed: Dec. 23, 2014

(51) Int. Cl.
*H01L 21/66* (2006.01)
*H01L 21/3213* (2006.01)

(52) U.S. Cl.
CPC .......... *H01L 22/20* (2013.01); *H01L 21/32136* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 5,223,081 A | 6/1993 | Doan | |
| 5,719,495 A | 2/1998 | Moslehi | |
| 6,368,881 B1 | 4/2002 | Brouillette et al. | |
| 6,426,232 B1 | 7/2002 | Litvak | |
| 6,462,381 B1 | 10/2002 | Beebe et al. | |
| 6,730,604 B1 * | 5/2004 | Liu | H01L 22/20 118/725 |
| 6,787,797 B2 | 9/2004 | Demizu et al. | |

(Continued)

FOREIGN PATENT DOCUMENTS

| | | |
|---|---|---|
| EP | 0549995 A2 | 7/1993 |
| EP | 1649323 A2 | 4/2006 |
| WO | 00/33368 A1 | 6/2000 |

OTHER PUBLICATIONS

Adderly et al., "The Effect of Backside Roughness on Al Interconnect Dimensions for RF CMOS SOI Devices", IBM Microelectronics Division, IEEE, ASMC 2014, pp. 384-388.

(Continued)

*Primary Examiner* — Charles Garber
*Assistant Examiner* — Steven Christopher
(74) *Attorney, Agent, or Firm* — Gibb & Riley, LLC; Steven J. Meyers, Esq.

(57) ABSTRACT

Disclosed is a method of manufacturing integrated circuit (IC) chips. In the method, wafers are received and the backside roughness levels of these wafers are determined. Based on the backside roughness levels, the wafers are sorted into different groups. Chips having the same design are manufactured on wafers from all of the different groups. However, during manufacturing, process(es) is/are performed differently on wafers from one or more of the different groups to minimize systematic variations in a specific parameter (e.g., wire width) in the resulting chips. Specifically, because systematic variations may occur when the exact same processes are used to form IC chips on wafers with different backside roughness levels, the method disclosed herein selectively adjusts one or more of those processes when performed on wafers from one or more of the different groups to ensure that the specific parameter is approximately equal in the resulting integrated IC chips.

15 Claims, 10 Drawing Sheets

(56) References Cited

U.S. PATENT DOCUMENTS

| | | |
|---|---|---|
| 7,612,890 B2 | 11/2009 | Drake, Jr. |
| 7,968,354 B1 | 6/2011 | Haller et al. |
| 8,072,044 B2 | 12/2011 | Gruenhagen et al. |
| 8,288,251 B2 | 10/2012 | Akiyama |
| 8,513,080 B2 | 8/2013 | Kronholz et al. |
| 2015/0021743 A1* | 1/2015 | Adderly ............ H01L 21/30604 257/618 |
| 2015/0044785 A1* | 2/2015 | Fonseca ............ H01L 21/30625 438/8 |

OTHER PUBLICATIONS

Hill et al., "Pattern Density Based Prediction for Deep Reactive Ion Etch (DRIE)", Microsystems Technology Laboratories, Massachusetts Institute of Technology, Cambridge, MA , pp. 1-4.

* cited by examiner

METHOD OF FINE-TUNING PROCESS CONTROLS DURING INTEGRATED CIRCUIT CHIP MANUFACTURING BASED ON SUBSTRATE BACKSIDE ROUGHNESS

BACKGROUND

The present invention relates to fine-tuning process controls during integrated circuit chip manufacturing in order to limit systematic wafer-to-wafer and/or lot-to-lot variability.

Silicon-on-insulator (SOI) wafers have been increasingly in demand for manufacturing integrated circuit chips. Such SOI wafers are typically fabricated using a "smart cut" technique. In this technique, a thermal oxide layer is grown on a bulk silicon wafer and a hydrogen implantation process is performed to form a cleavage plane within the bulk silicon wafer. The bulk silicon wafer is then bonded to a handle wafer and split in two at the cleavage plane, thereby forming the SOI wafer. Additional processing includes frontside smoothing (e.g., by polishing or thermal annealing) and backside roughening (e.g., by a coarse wheel grinder) to prevent slippage during automated robot handling.

Oftentimes integrated circuit chip manufacturers use SOI wafers from different suppliers that use slightly different techniques and/or equipment to form the SOI wafers and/or use SOI wafers from a single supplier with different wafer fabrication facilities that use slightly different techniques and/or equipment to form the SOI wafers. Recently, it has been discovered that systematic variations occur on integrated circuit chips manufactured on SOI wafers from different suppliers. For example, average metal wire width and, thereby average metal wire resistance (also referred to as sheet resistance) varies significantly between integrated circuit chips manufactured according to the same integrated circuit chip design on SOI wafers from different suppliers. Such systematic variations can have a negative impact on yield.

SUMMARY

In view of the foregoing, disclosed herein are embodiments of a method of manufacturing integrated circuit chips, wherein process controls are fine-tuned in order to minimize systematic variations. In this method, wafers can be received (e.g., from multiple different suppliers). The backside roughness levels of these wafers can be determined and, based on the backside roughness levels, the wafers can be sorted into two or more different groups. Integrated circuit chips having the same integrated circuit chip design can be manufactured on wafers from all of the different groups; however, during manufacturing, one or more processes can be performed differently on wafers from one or more of the different groups in order to minimize systematic wafer-to-wafer and/or lot-to-lot variations in a specific parameter in the resulting integrated circuit chips. As discussed in greater detail in the detailed description section, such systematic variations can be temperature-dependent variations that are exhibited due to the different heating and/or cooling properties of wafers having different backside roughness levels. Thus, any temperature-dependent process can be fine-tuned (i.e., adjusted) for one or more of the different groups in order to balance out such temperature-dependent variations.

For example, in many etch processes (e.g., reactive-ion etch (RIE) processes), etch characteristics may be temperature-dependent. Thus, in specific embodiments of the method described below, at least one etch process can be performed differently on the different groups of wafers in order to balance out any variations in etch characteristics that are exhibited due to the different heating and/or cooling properties of the wafers in the different groups and, thereby to minimize systematic wafer-to-wafer and/or lot-to-lot variations in a dimension (e.g., width) of an on-chip feature.

In one embodiment, multiple wafers can be received (e.g., from multiple different suppliers). The backside roughness levels of these wafers can be determined and, based on the backside roughness levels, the wafers can be sorted into multiple different groups. Integrated circuit chips having the same integrated circuit chip design can be manufactured on wafers from all of the different groups. In this case, the manufacturing process can comprise, for each wafer, forming a first layer on a frontside of the wafer and further forming a second layer above the first layer. Then, openings can be formed in the second layer, creating a mask. After the openings are formed in the second layer, an etch process can be performed in order to form openings in the first layer, which are aligned below the openings in the second layer. However, this etch process can be performed differently on the different groups of wafers so as to minimize variations in the width of the openings in the first layer. The first layer can comprise any material layer (e.g., a dielectric layer, a single crystalline semiconductor layer, a polycrystalline semiconductor layer, a metal layer, etc.) that requires patterning.

In another, more specific, embodiment, multiple wafers can be received (e.g., from multiple different suppliers). The backside roughness levels of these wafers can be determined and, based on the backside roughness levels, the wafers can be sorted into multiple different groups. Integrated circuit chips having the same integrated circuit chip design can be manufactured on wafers from all of the different groups. In this case, the manufacturing process can comprise, for each wafer, forming a metal layer on a frontside of the wafer, forming a hard mask layer above the metal layer, and forming a photoresist layer above the metal layer. The photoresist layer can then be patterned and, specifically, first openings can be formed in the photoresist layer. Then, a an etch process (e.g., a reactive ion etch (RIE) process) can be performed in order to form, in the hard mask layer, second openings aligned below the first openings and separated by hard mask features. After the second openings are formed in the hard mask layer, an additional etch process (e.g., a plasma etch process) can be performed in order to form, in the metal layer, third openings, which are aligned below the second openings and separated by metal wires that are aligned below the hard mask features. In this embodiment, the reactive ion etch process can be performed differently on the different groups of wafers so as to minimize variations in the width of the second openings in the hard mask layer and, thereby in the widths the hard mask features. As a result, variations in the widths of the third openings in the metal layer and in the metal wires are also minimized.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, silicon-on-insulator (SOI) wafers have been increasingly in demand for manufacturing integrated circuit chips. Such SOI wafers are typically fabricated using a "smart cut" technique. In this technique, a thermal oxide layer is grown on a bulk silicon wafer and a hydrogen implantation process is performed to form a cleavage plane within the bulk silicon wafer. The bulk silicon wafer is then bonded to a handle wafer and split in two at the cleavage plane, thereby forming the SOI wafer. Additional processing includes frontside smoothing of (e.g., by polishing or thermal annealing) and backside roughening (e.g., by a coarse wheel grinder) to prevent slippage during automated robot handling.

Oftentimes integrated circuit chip manufacturers use SOI wafers from different suppliers that use slightly different techniques and/or equipment to form the SOI wafers and/or use SOI wafers from a single supplier with different wafer fabrication facilities that use slightly different techniques and/or equipment to form the SOI wafers. Recently, it has been discovered that systematic variations occur on integrated circuit chips manufactured on SOI wafers from different suppliers. For example, average metal wire line width and, thereby average metal wire resistance (also referred to as sheet resistance) varies significantly between integrated circuit chips manufactured according to the same integrated circuit chip design on SOI wafers from different suppliers. Such systematic variations can have a negative impact on yield. One explanation for these systematic variations is that SOI wafers, which are fabricated by different suppliers using different techniques and/or equipment (or by the same supplier at different fabrication facilities using different techniques and/or equipment), tend to have different backside roughness levels and these different backside roughness levels result in different heating and cooling properties. Specifically, SOI wafers with relatively high backside roughness levels tend to cool more quickly during processing, whereas SOI wafers with relatively low backside roughness levels tend to cool more slowly during processing. If one or more of the process steps performed during integrated circuit chip manufacturing are temperature-dependent, the different heating and/or cooling properties of the SOI wafers can cause systematic wafer-to-wafer and/or lot-to-lot variations in one or more on-chip parameters. Such systematic variations can have a negative impact on yield.

In view of the foregoing, disclosed herein are embodiments of a method of manufacturing integrated circuit chips, wherein process controls are fine-tuned in order to minimize systematic variations. In the method, wafers can be received and the backside roughness levels of these wafers can be determined. Based on the determined backside roughness levels, the wafers can be sorted into multiple different groups. Integrated circuit chips having the same integrated circuit chip design can be manufactured on wafers from all of the different groups. However, during manufacturing, one or more processes can be performed differently on wafers from one or more of the different groups in order to minimize systematic variations in a specific parameter in the resulting integrated circuit chips. Specifically, because systematic variations may occur in a specific parameter when the exact same processes are used to form the integrated circuit chips on wafers with different backside roughness levels, the method disclosed herein selectively adjusts one or more of those processes when performed on wafers from one or more of the different groups to ensure that the specific parameter is approximately equal in the resulting integrated circuit chips.

Figure 1:
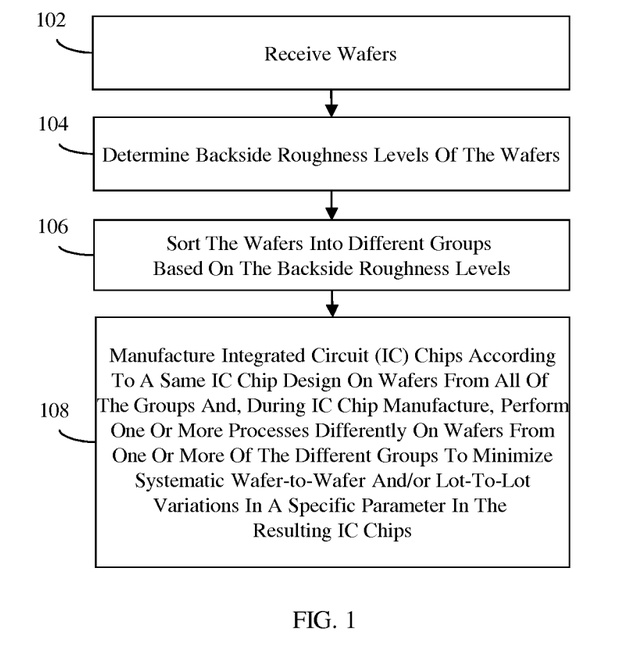
FIG. 1 is flow diagram illustrating an embodiment of a method of manufacturing integrated circuit chips.

More particularly, referring to the flow diagram of FIG. 1, disclosed herein is a method of manufacturing integrated circuit chips. In the method, wafers can be received by an integrated circuit chip manufacturer (102). The wafers can comprise, for example, silicon-on-insulator (SOI) wafers or any other semiconductor-on-insulator wafer. Such silicon-on-insulator or semiconductor-on-insulator wafers can be fabricated using the conventional "smart cut" technique described above. In any case, the wafers can be received from multiple different suppliers that use slightly different techniques and/or equipment to form the wafers and/or from a single supplier with different wafer fabrication facilities that use slightly different techniques and/or equipment to form the wafers. The different techniques and/or different equipment (e.g., wheel grinders with different coarseness grades) can result in wafers with different backside roughness levels.

The backside roughness levels of these wafers can be determined (104). Those skilled in the art will recognize that the surface roughness of wafers is typically measured in Angstroms and various different contact and/or non-contact techniques for measuring surface roughness levels can be used. Such techniques include, but are not limited to, scanning probe microscopy (e.g., atomic force microscopy (AFM), also referred to herein as scanning force microscopy (SFM)), total integrated scatter (TIS), interferometry (IF) and optical profilometry (OP). Generally, the backside roughness levels of a wafer that has undergone a roughening process (i.e., grinding process) will range from 2000 Angstroms, which is relatively low for a backside of a wafer following a roughening procedure, up to 4000 Angstroms, which is relatively high.

Figure 2A:
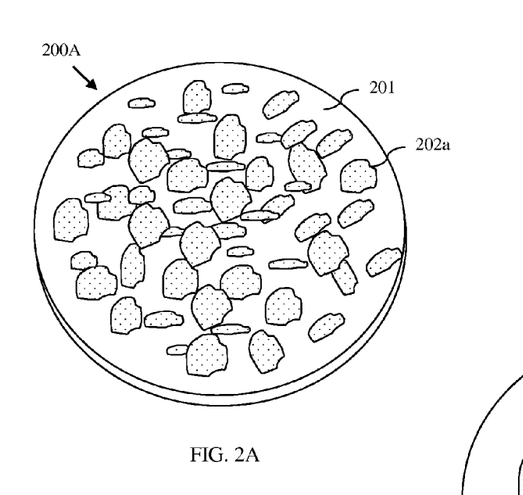
FIGS. 2A-2C are bottom view illustrations of exemplary SOI wafers with low, medium and high backside roughness levels, respectively.
Figure 2B:
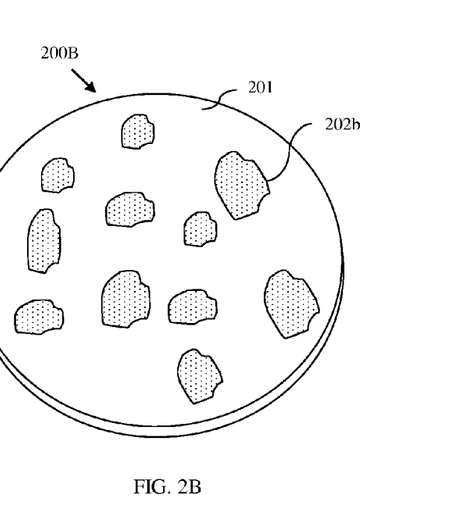
Figure 2C:
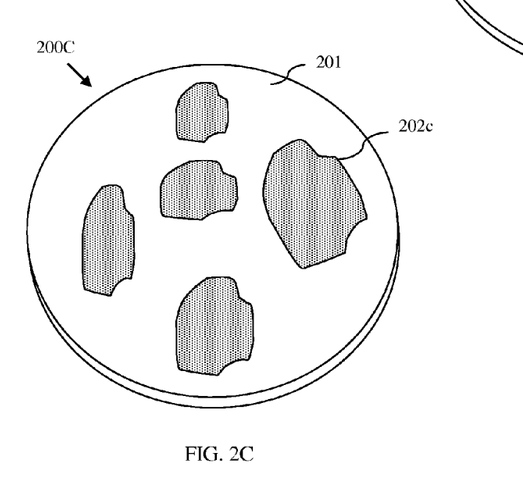

FIGS. 2A-2C illustrate exemplary SOI wafers 200A-200C with low, medium and high backside roughness levels, respectively. Specifically, the SOI wafer 200A of FIG. 2A has a relatively low backside roughness level evidenced by the pits 202a on its backside 201 that are relatively shallow (as indicated by the shading pattern with a relatively low dot-density), relatively small and in greater numbers (i.e., high density). The SOI wafer 200C of FIG. 2C has a relatively high backside roughness level evidenced by the pits 202c on its backside 201 that are relatively deep (as indicated by the shading pattern with a relatively high dot-density), large and in fewer numbers (i.e., low density). The SOI wafer 200B of FIG. 2B has a medium backside roughness level evidenced by the pits 202b on its backside 201 that are a medium depth (as indicated by the shading pattern with a medium dot-density), medium size and in medium numbers (i.e., medium density) relative to the depth, size and density of the SOI wafers 200A and 200C with low and high backside roughness levels respectively.

Based on the previously determined backside roughness levels, the wafers can be sorted into two or more different groups, wherein the groups are associated with different backside roughness level ranges (106). Each group can contain all wafers falling within a given range of backside roughness levels. For example, the wafers can be sorted into two different groups: those with low backside roughness levels ranging, for example, from 2000-2999 Angstroms and those with high backside roughness levels ranging, for example, from 3000-4000 Angstroms. Alternatively, the wafers can be sorted into three or more different groups. For purposes of illustration, the method will be described with reference to sorting the wafers into three different groups: those with low backside roughness levels ranging, for example, from 2000-2750 Angstroms (see FIG. 2A), those with medium backside roughness levels ranging, for example, from 2751-3250 Angstroms (see FIG. 2B), and those with high backside roughness levels ranging, for example, from 3251-4000 Angstroms (see FIG. 2C).

Integrated circuit chips can then be manufactured, according to the same specific integrated circuit chip design, on wafers from all of the different groups; however, during manufacturing, one or more processes can be performed differently (i.e., selectively adjusted) on wafers from one or more of the different groups in order to minimize systematic wafer-to-wafer and/or lot-to-lot variations in a specific parameter (e.g., in a dimension of patterned features such as in the width of metal wires) in the resulting integrated circuit chips (108).

Figure 3:
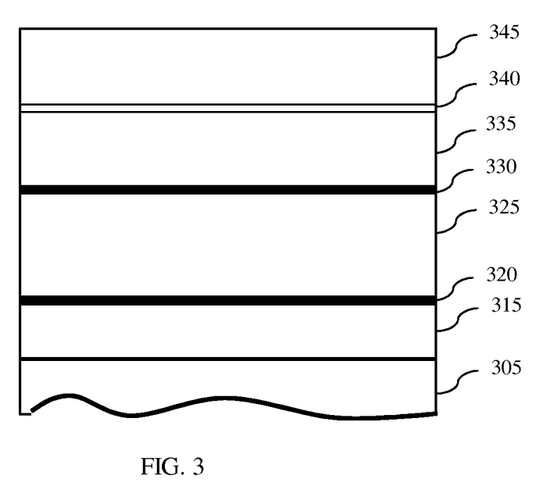
FIG. 3 is a cross-section diagram illustrating a partially completed integrated circuit chip.

Specifically, as mentioned above, wafers with different backside roughness levels have different heating and/or cooling properties and the different heating and/or cooling properties can cause systematic temperature-dependent variations when the wafers are processed in the exact same manner. For example, in the case of the systematic variations in wire width, the temperature-dependent process at issue can be a reactive ion etch (RIE) process, which is used during processing to pattern a hard mask layer above a metal layer. More specifically, various techniques are known for forming back end of the line (BEOL) metal wires (e.g., aluminum wires) on the frontside of a wafer within the interlayer dielectrics above a device layer. In one technique, a metal layer 325 (e.g., an aluminum layer or other suitable metal layer) can be deposited above one or more interlayer dielectric layers 315 (e.g., silicon dioxide layer(s), silicon nitride layer(s), silicon oxynitride layer(s), borophosphosilicate glass (BPSG) layer(s), etc.) on the frontside of each wafer above a device layer 305. Optionally, one or more additional relatively thin conductive layers 320, 330 (e.g., a barrier layer of, for example, titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion and/or an adhesion layer of, for example, tantalum (Ta), ruthenium (Ru), a tantalum ruthenium (TaRu) alloy or any other suitable metal or metal alloy that promotes adhesion of the metal layer 325) can be formed immediately before and/or after deposition of the metal layer 325. A hard mask layer 335 (e.g., a silicon dioxide hard mask layer) can be deposited above the metal layer 325 and an anti-reflective coating 340 and a photoresist layer 345 can be deposited above the hard mask layer 335 (see FIG. 3).

Figure 4:
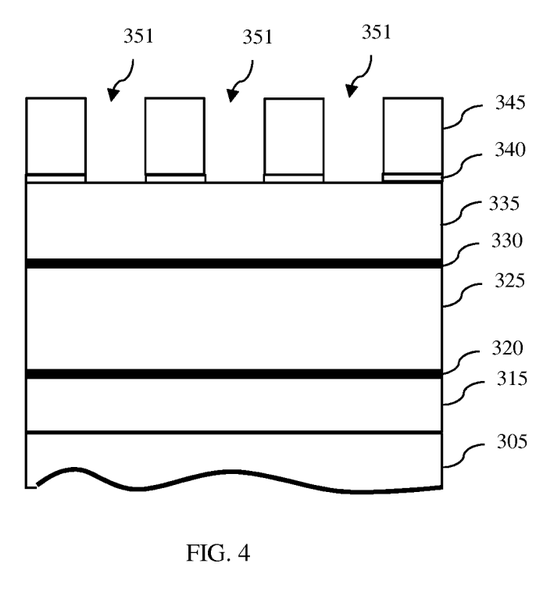
FIG. 4 is a cross-section diagram illustrating a partially completed integrated circuit chip.

Using conventional lithographic patterning techniques, the photoresist layer 345 can be patterned with openings 351 (i.e., openings 351 can be formed in the photoresist layer 345) so as to expose portions of the hard mask layer 335 below) (see FIG. 4). The openings 351 can be patterned so as to have specific dimensions designed to achieve a target pattern density. For purpose of this disclosure, "pattern density" refers to the area fraction of exposed surface of a layer below the patterned layer (e.g., a patterned photoresist layer, a patterned hard mask layer, etc.).

Figure 5A:
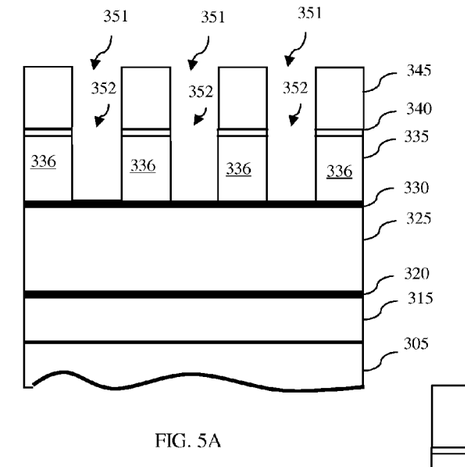
FIGS. 5A-5C are cross-section diagrams illustrating backside roughness level-dependent variations in partially completed integrated circuit chips.
Figure 5B:
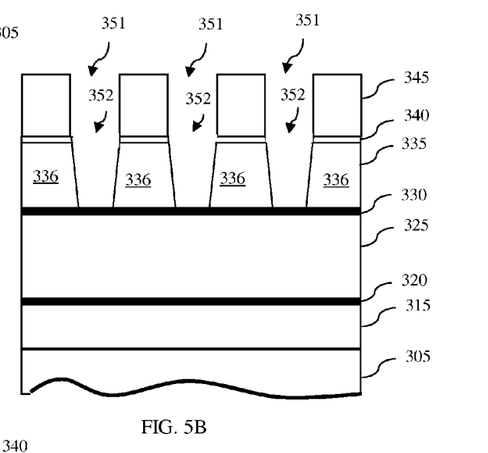
Figure 5C:
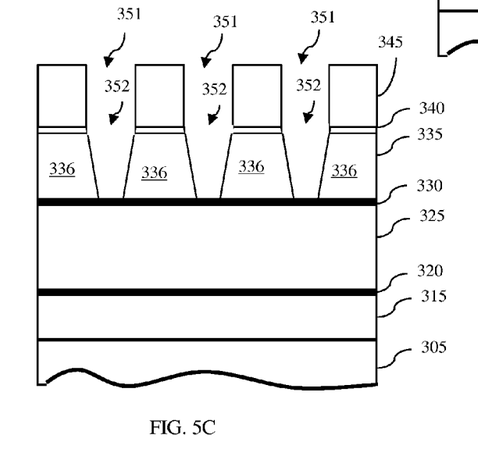
Figure 6A:
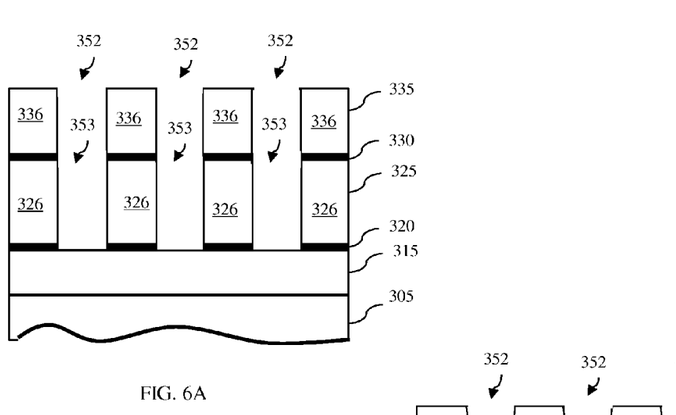
FIGS. 6A-6C are cross-section diagrams illustrating backside roughness level-dependent variations in partially completed integrated circuit chips.
Figure 6B:
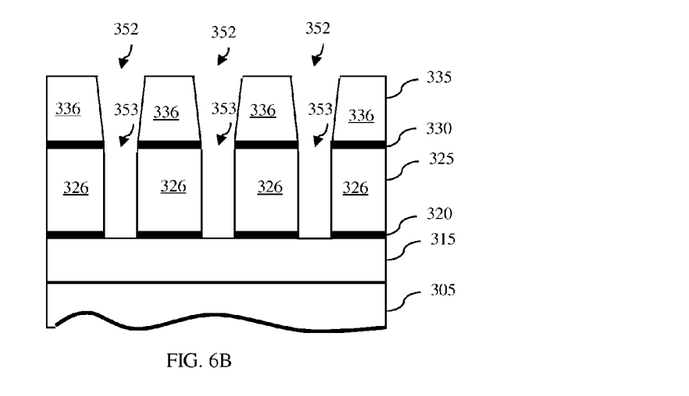
Figure 6C:
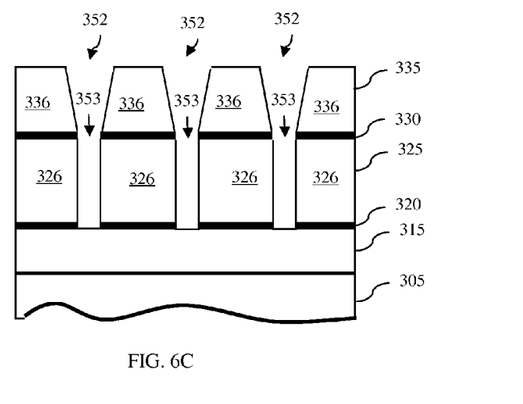

After the photoresist layer 345 is patterned with the openings 351, the exposed portions of the hard mask layer 335 can be etched (e.g., using a reactive ion etch (RIE) process) in order to pattern the hard mask layer 335 with openings 352 aligned below the openings 351 in the photoresist layer 345 and separated by (i.e., positioned laterally between) hard mask features 336. The goal of this RIE process is typically to achieve essentially the same target pattern density in the hard mask layer 335 as was achieved in the photoresist layer 345. However, it has been noted that systematic variations in the pattern density occur because of backside roughness level-dependent variations (and, more particularly, temperature-dependent variations due to different backside roughness levels) in the slope of the sidewalls of the openings 352 in the hard mask layer 335. Specifically, on SOI wafers that cool more slowly (i.e., on SOI wafers with a low backside roughness level), as shown in FIG. 5A, the slope of the sidewalls of the openings 352 is approximately normal to the top surface of the hard mask layer 335, thereby exposing a relatively large portion of the metal layer 325 below (i.e., thereby achieving a relatively high pattern density that is approximately equal to the pattern density of the photoresist layer). On SOI wafers that cool more quickly (i.e., on SOI wafers with a high backside roughness level), as shown in FIG. 5C, the slope of the sidewalls of the openings 352 is at a relatively large angled, thereby exposing a relatively small portion of the metal layer 325 below (i.e., thereby achieving a relatively low pattern density that is significantly less than the pattern density of the photoresist layer). On SOI wafers that have cooling properties in between (i.e., on SOI wafers with a medium backside roughness level), as shown in FIG. 5B, the slope of the sidewalls of the openings is between that shown in FIGS. 5A and 5C, thereby achieving a medium pattern density. As a result, when the exposed portions of the metal layer 325 are subsequently etched (e.g., using a plasma etch process) in order to pattern the metal layer 325 with openings 353 aligned below the openings 352 in the hard mask layer 335 and separated by (i.e., positioned laterally between) metal wires 326, the resulting metal wires 326 have varying widths and, thereby varying resistances. Specifically, on SOI wafers that cool more slowly (i.e., on SOI wafers with a low backside roughness level), as shown in FIG. 6A, a relatively large portion of the metal layer 325 will be etched such that the metal wires 326 have a relatively small width and, thereby a relatively large resistance. On SOI wafers that cool more quickly (i.e., on SOI wafers with a high backside roughness level), as shown in FIG. 6C, a relatively small portion of the metal layer 325 will be etched such that the metal wires 326 have a relatively large width and, thereby a relatively small resistance. On SOI wafers that have cooling properties in between (i.e., on SOI wafers with a medium backside roughness level), as shown in FIG. 6B, the metal wires 326 have a width in between the width of the metal wires 326 shown in FIGS. 6A and 6C and, thus, will have a resistance that is also in between.

The method disclosed herein provides for fine-tuning (i.e., adjusting) any temperature-dependent process (such as the reactive ion etch process used in metal wire formation, as described above, or any other temperature-dependent process) and, optionally, any other process for one or more of the different groups during manufacturing of integrated circuit chips according to a specific integrated circuit chip design at process 108 in order to balance out such temperature-dependent variations.

Figure 7:
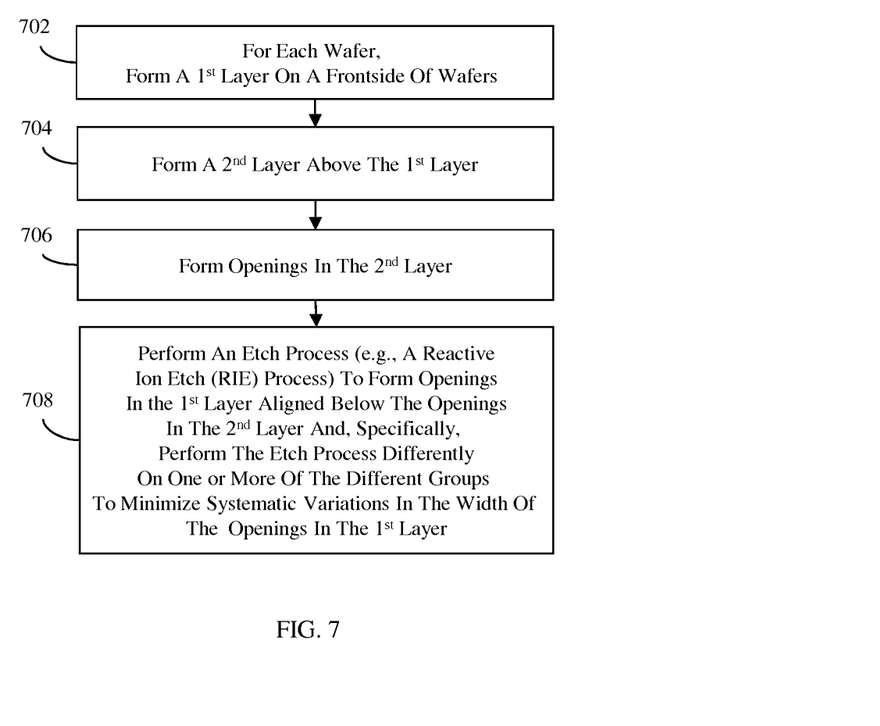
FIG. 7 is flow diagram illustrating another embodiment of a method of manufacturing integrated circuit chips.
Figure 8:
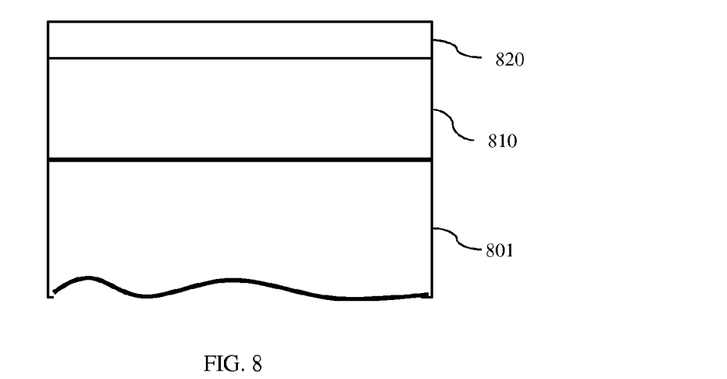
FIG. 8 is a cross-section diagram illustrating a partially completed integrated circuit chip manufactured according to the method of FIG. 7.

For example, referring to the flow diagram of FIG. 7, in one embodiment the manufacturing process 108 of FIG. 1 can specifically comprise, for each wafer, forming a first layer 810 on a frontside of the wafer 701 (702) and further forming a second layer 820 above the first layer 810 (704, see FIG. 8).

Figure 9:
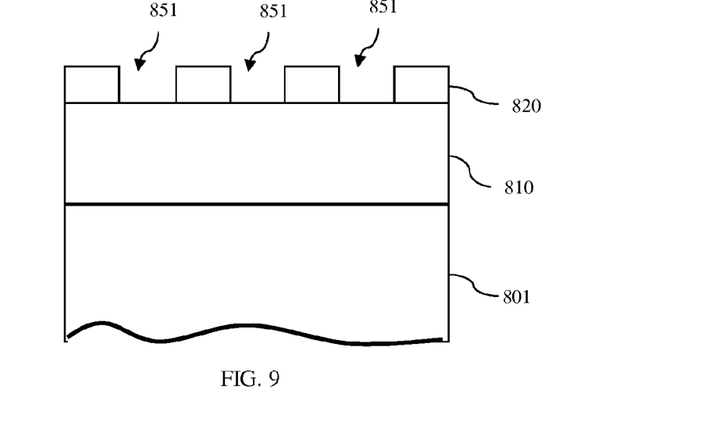
FIG. 9 is a cross-section diagram illustrating a partially completed integrated circuit chip manufactured according to the method of FIG. 7.

Then, openings 851 can be formed in the second layer 820 (i.e., the second layer 820 can be patterned with openings 851) (706, see FIG. 9). For example, the second layer 820 can comprise a photoresist layer and conventional lithographic processing techniques can be performed in order to form the openings 851 within the photoresist layer. Alternatively, the second layer 820 can comprise any other material layer suitable for use as a mask and can be patterned using any other suitable mask patterning techniques.

Figure 10:
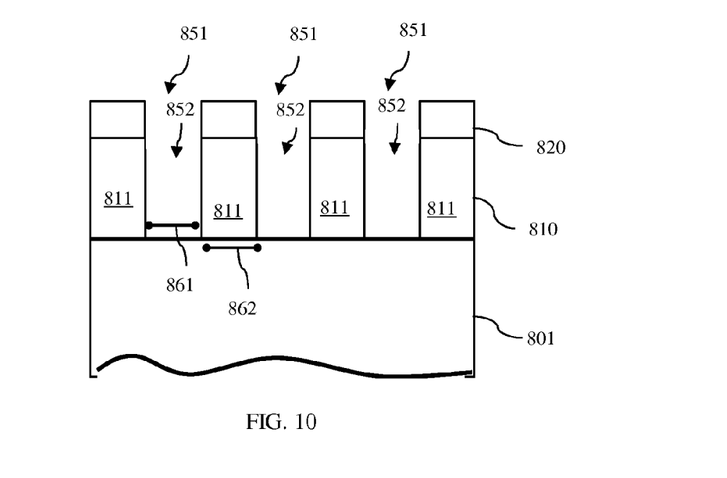
FIG. 10 is a cross-section diagram illustrating a partially completed integrated circuit chip manufactured according to the method of FIG. 7.

In any case, after the second layer 820 is patterned with openings 851, an etch process (e.g., a reactive ion etch (RIE) process) can be performed in order to form openings 852 in the first layer 810 such that the openings 852 are aligned below the openings 851 in the second layer 820 and such that the openings 852 are separated by remaining portions of the first layer 810 (i.e., by specific features 811) (708, see FIG. 10). However, this etch process can be performed differently on the different groups of wafers with the different backside roughness levels so as to minimize systematic wafer-to-wafer and/or lot-to-lot variations in the width 861 of the openings 852 in the first layer 810 due to different backside roughness levels, thereby so as to minimize systematic wafer-to-wafer and/or lot-to-lot variations in the width 862 of the specific features 811 (i.e., the remaining portions of the first layer 810).

Specifically, this etch process can be performed using different etch recipes for the different groups of wafers. For example, for a low backside roughness level group, a first recipe developed to achieve a target dimension (e.g., a target width 861 of the openings 852 in the first layer 810 and/or a target width 862 of the specific features 111) at a nominal temperature can be used; for a high backside roughness level group, a second recipe developed to achieve the target dimension (e.g., the target width 861 of the openings 852 in the first layer 810 and/or the target widths 862 of the specific features 811) at a different temperature and, particularly, a lesser temperature than the nominal temperature; and so on. Those skilled in the art will recognize that the recipes may vary depending upon the pattern density of the second layer 820 (i.e., the area fraction of the surface of the first layer 810 exposed by patterning the openings 851 in the second layer 820). In any case, the first recipe used for the low backside roughness level group can be a recipe developed to achieve a target pattern density in the first layer 810 at the nominal temperature and the second recipe used for the high backside roughness level group can be a recipe originally developed to achieve a different pattern density in the first layer 810 and, particularly, a greater pattern density, at the nominal temperature, but which can be substituted to achieve the target pattern density at the lesser temperature.

In any case, the first layer 810 can comprise a stack of one or more layers of one or more materials and, depending upon the materials, this first layer 810 can be patterned with the openings 852 in order to form the specific features 811 on the frontside of the wafer 701. For example, the first layer 810 can comprise hard mask layer (e.g., a silicon dioxide layer or other suitable hard mask material layer) and this first layer 810 can be patterned with the openings 852 such that the specific features 811 comprise hard mask features used for subsequently patterning a layer (e.g., a metal layer, a semiconductor layer, a dielectric layer, etc.) below. Alternatively, the first layer 810 can comprise a gate stack comprising one or more gate dielectric layers (e.g., a silicon dioxide layer, a high-K gate dielectric layer, or any other suitable gate dielectric layer) and one or more gate conductor layers (e.g., a polysilicon gate conductor layer, a metal gate conductor layer or any other suitable gate conductor layer) on the gate dielectric layer(s) and this first layer 810 can be patterned with the openings 852 such that the specific features 811 comprise discrete gate structures for field effect transistors. Alternatively, this first layer 810 can comprise any material layer(s) requiring patterning using, for example, a RIE process to form any other specific features.

Figure 11:
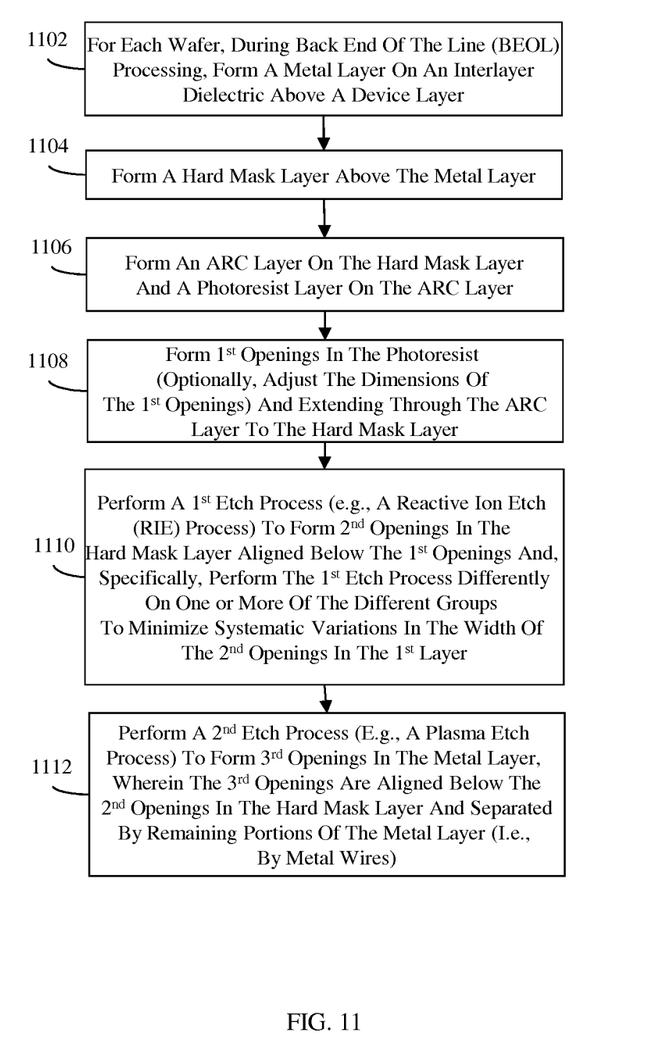
FIG. 11 is flow diagram illustrating yet another embodiment of a method of manufacturing integrated circuit chips.
Figure 12:
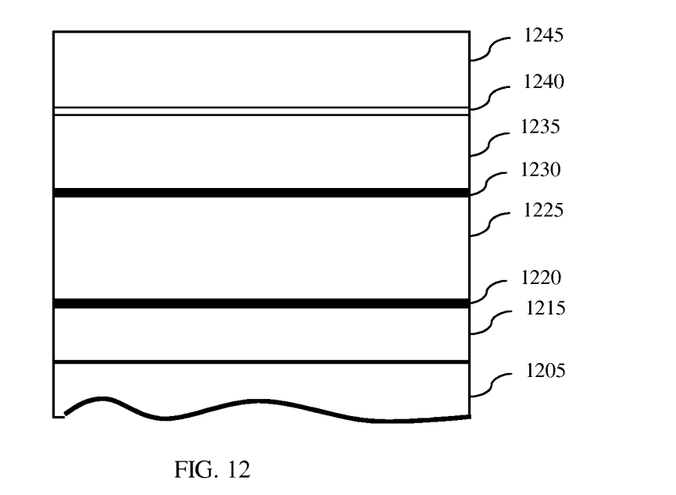
FIG. 12 is a cross-section diagram illustrating a partially completed integrated circuit chip manufactured according to the method of FIG. 11.

Referring to the flow diagram of FIG. 12, in another, more specific, embodiment, the manufacturing process 108 of FIG. 1 can specifically comprise, for each wafer, forming a metal layer 1225 (e.g., an aluminum layer or other suitable metal layer) above one or more interlayer dielectric layers 1215 (e.g., silicon dioxide layer(s), silicon nitride layer(s), silicon oxynitride layer(s), borophosphosilicate glass (BPSG) layer(s), etc.) on the frontside of each wafer above a device layer 1205 (1102, see FIG. 12). Optionally, one or more additional relatively thin conductive layers 1220, 1230 (e.g., a barrier layer of, for example, titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion and/or an adhesion layer of, for example, tantalum (Ta), ruthenium (Ru), a tantalum ruthenium (TaRu) alloy or any other suitable metal or metal alloy that promotes adhesion of the metal layer 1225) can be formed immediately before and/or after formation of the metal layer 1225 at process 1102. A hard mask layer 1235 (e.g., a silicon dioxide hard mask layer or other suitable hard mask layer) can then be formed above the metal layer 1225 (1104) and an anti-reflective coating 1240 and a photoresist layer 1245 can be formed above the hard mask layer 1235 (1106, see FIG. 12).

Figure 13:
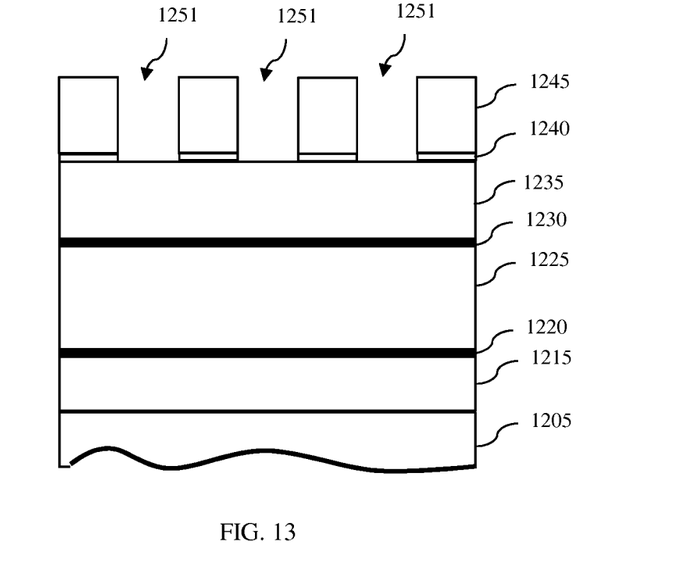
FIG. 13 is a cross-section diagram illustrating a partially completed integrated circuit chip manufactured according to the method of FIG. 11.

Using conventional lithographic patterning techniques, the photoresist layer 1245 can be patterned with first openings 1251 (i.e., first openings 1251 can be formed in the photoresist layer 1245) so as to expose portions of the hard mask layer 1235 below (1108, see FIG. 13). The first openings 1251 can be patterned at process 1108 so as to have specific dimensions designed to achieve a target pattern density. As mentioned above, "pattern density" refers to the area fraction of exposed surface of a layer below the patterned layer (e.g., a patterned photoresist layer, a patterned hard mask layer, etc.). Optionally, the target pattern density of the photoresist layer can be selectively adjusted in order to accommodate other adjustments to the process controls at step 1110 discussed below.

Figure 14:
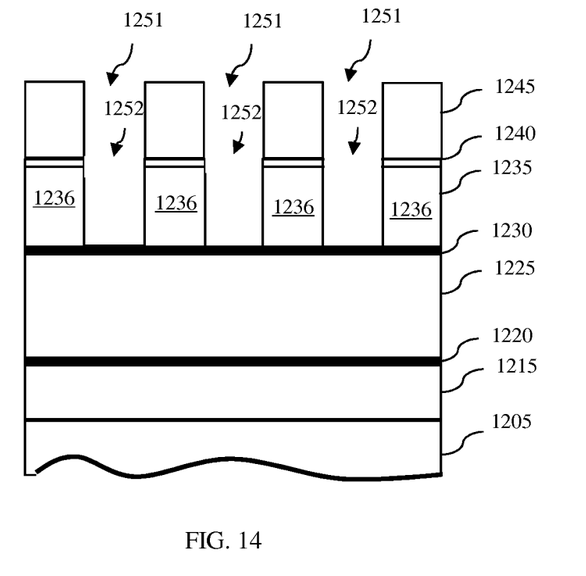
FIG. 14 is a cross-section diagram illustrating a partially completed integrated circuit chip manufactured according to the method of FIG. 11; and, FIG. 15 is a cross-section diagram illustrating a partially completed integrated circuit chip manufactured according to the method of FIG. 11.

After the photoresist layer 1245 is patterned with the first openings 1251, the exposed portions of the hard mask layer 1235 within the first openings 1251 can be etched (e.g., using a reactive ion etch (RIE) process) in order to pattern the hard mask layer 1235 with second openings 1252 aligned below the first openings 1251 in the photoresist layer 1245 and separated by (i.e., positioned laterally between) remaining portions of the hard mask layer (i.e., hard mask features 1236) (1110, see FIG. 14). The goal of this RIE process is typically to achieve essentially the same target pattern density in the hard mask layer 1245 as was achieved in the photoresist layer 1245.

Figure 15:
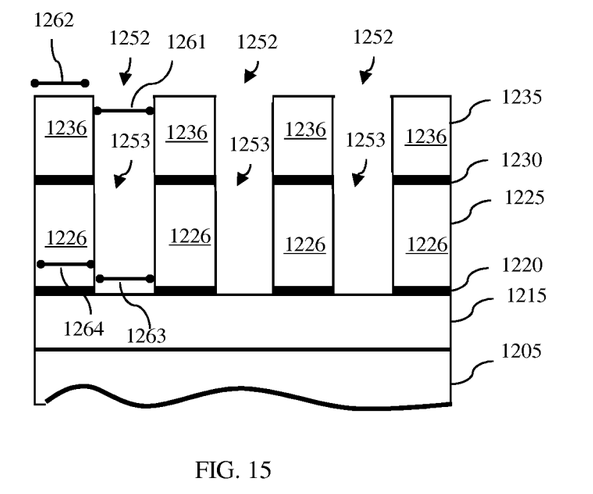

After the second openings 1252 are formed in the hard mask layer 1235, an additional etch process (e.g., a plasma etch process) can be performed in order to form, in the metal layer 1225, third openings 1253, which are aligned below the second openings 1252 in the hard mask layer 1235 and separated by (i.e., positioned laterally between) the remaining portions of the metal layer 1225 (i.e., the metal wires 1226), which are aligned below the hard mask features 1236 and have a wire width 1264 (1112, see FIG. 15).

In this embodiment, to avoid or at least minimize the systematic wafer-to-wafer and/or lot-to-lot variations in the wire width 1264 and, thereby in the resistance of the wires 1226 in the resulting integrated circuit chips, due to different backside roughness levels, as discussed above and illustrated in 6A-6B, the RIE process used to form the second openings 1252 in the hard mask layer 1235 at process 1110 can be performed differently on the different groups of wafers. Specifically, this RIE process can be performed using different etch recipes for the different groups of wafers. For example, for a low backside roughness level group, a first recipe developed to achieve a target dimension (e.g., a target width 1261 of the second openings 1252 in the hard mask layer 1235 and, thereby a target width 1262 of the remaining hard mask features 1236) at a nominal temperature can be used; for a high backside roughness level group, a second recipe developed to achieve the target dimension (e.g., the target width 1261 of the second openings 1252 in the hard mask layer 1235 and, thereby the target width 1262 of the remaining portions hard mask features 1236) at a different temperature and, particularly, a lesser temperature than the nominal temperature; and so on. Those skilled in the art will recognize that the recipes may vary depending upon the pattern density of the photoresist layer 1245 (i.e., the area fraction of the surface of the hard mask layer 1235 exposed by patterning the openings 1251 in the photoresist layer 1245). In any case, the first recipe can be a recipe developed to achieve a target pattern density in the hard mask layer 1235 at the nominal temperature and the second recipe can be a recipe originally developed to achieve a different pattern density in the hard mask layer 1235 according to a different IC chip design and, particularly, a greater pattern density, at the nominal temperature, but which can be substituted herein to achieve the target pattern density at the lesser temperature. In the case of RIE of a hard mask layer 1235 comprising silicon dioxide, the differences in the etch recipes used on the wafers from the different groups can be limited to differences in the oxygen flow density used. For example, the second recipe used for wafers in the high backside roughness level group can require a greater oxygen flow density than the first recipe in order to increase the width of the second openings 1252 as compared to what that width would be if the first recipe were used. As a result of minimizing the variations in the widths 1261 of the second openings 1252 in the hard mask layer 1235, variations in the widths 1262, 1263 and 1264 of the hard mask features 1236, of the third openings 1253 in the metal layer 1225 and of the metal wires 1226, respectively, are also minimized.

The following example illustrates how the processes can be fine-tuned for the different groups of wafers during manufacturing of integrated circuit chips according to a specific integrated circuit chip design to minimize systematic variation and, particularly, how processes can be fine-tuned during metal wire formation to minimize systematic variation in wire width. Referring to the FIGS. 11-15, manufacturing specifications may dictate target widths for the first openings 1251 formed in the photoresist layer 1245 at process 1108, for the second openings 1252 formed in the hard mask layer 1235 at process 1110 (e.g., 285 nm and 275 nm respectively) and for the metal wires 1226 formed at process 1112 (e.g., 300 nm). The target width of the metal wires 1226 is also referred to herein as the target critical dimension of wires 1226. However, if the same exact process steps with the same process controls are performed on all wafers regardless of backside roughness levels, a large variation will occur in the average width of the metal wires 1226 formed at process 1112 on wafers from the different groups of wafers. For example, wafers from the low backside roughness level group may have an average width, for example, of 282 nm; wafers from the high backside roughness level group may have an average width, for example, of 317 nm; and wafers from the medium backside roughness level group may have an average width, for example, of 302 nm.

One exemplary way of minimizing the variations in average wire width between the different groups of wafers, as mentioned above, is to maintain or increase the target width 1261 of the second openings 1252 in the hard mask layer 1235 for wafers from the low backside roughness level group and to decrease, by different amounts, the target width 1261 of the second openings 1252 in the hard mask layer 1235 for wafers from the high and medium backside roughness level groups. Optionally, the target width for the first openings 1251 in the photoresist layer 1245 can also be selectively adjusted to accommodate any adjustments in the target widths of the second openings 1252 in the hard mask layer 1235.

More specifically, one exemplary way of minimizing the variations in average wire width between the different groups of wafers (i.e., between wafers having different backside roughness levels) being manufactured according to a specific integrated circuit design is to, optionally, increase the target width for the first openings 1251 in photoresist layer 1245 by, for example, 10 nm for all of the wafers in all of the different groups. This can be achieved, for example, by developing a new photoresist recipe to achieve the increased target width for the first openings 1251 and, thereby to achieve a new target photoresist layer pattern density, or, alternatively, using a photoresist recipe that was previously developed to achieve the different target pattern density in a photoresist layer in a different IC chip design. Furthermore, the target width for the second openings 1252 in the hard mask layer 1235 on wafers from the low backside roughness level group can, for example, remain at 275 nm and, thus, the etch recipe used for this group can remain unchanged. However, the target width for the second openings 1252 in the hard mask layer 1235 on wafers from the high backside roughness level group can be decreased, for example, by 10 nm to 265 nm, and the target width for the second openings 1252 in the hard mask layer on wafers from the medium roughness level group can also be decreased, but by a lesser amount (e.g., by 5 nm to 270 nm). This can be achieved, for example, by developing new etch recipes to achieve the new target widths for the second openings 1252 in the hard mask layer 1235 in the high and medium backside roughness level groups and, thereby to achieve new target hard mask pattern densities, or, alternatively, using etch recipes that were previously developed to achieve the different target pattern densities in hard mask layers of different IC chip designs. Thus, the etch recipes used to form the second openings 1252 in the hard mask layer 1235 on the wafers from these two groups (i.e., the high and medium backside roughness level groups) will be selectively adjusted and will be different as compared to the etch recipe used to form the openings 1252 in the hard mask layer 1235 in the low backside roughness level group.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a method of manufacturing integrated circuit chips, wherein process controls are fine-tuned in order to minimize systematic variations. In the method, wafers can be received and the backside roughness levels of these wafers can be determined. Based on the backside roughness levels, the wafers can be sorted into different groups. Integrated circuit chips having the same integrated circuit chip design can be manufactured on wafers from all of the different groups. However, during manufacturing, one or more processes can be performed differently on wafers from one or more of the different groups in order to minimize systematic variations in a specific parameter in the resulting integrated circuit chips. Specifically, because systematic variations may occur in a specific parameter when the exact same processes are used to form the integrated circuit chips on wafers with different backside roughness levels, the method disclosed herein selectively adjusts one or more of those processes when performed on wafers from one or more of the different groups to ensure that the specific parameter is approximately equal in the resulting integrated circuit chips.

What is claimed is:

1. A method comprising:
   receiving multiple wafers;
   determining backside roughness levels of said wafers;
   sorting said wafers into different groups of wafers based on said backside roughness levels; and,
   manufacturing integrated circuit chips on said wafers, said manufacturing being performed according to integrated circuit chip design and comprising:
   for each wafer, forming a first layer on a frontside of said wafer;
   forming a second layer above said first layer;
   forming openings in said second layer; and,
   performing an etch process to form openings in said first layer aligned below said openings in said second layer, said etch process being performed differently on said different groups of wafers so as to minimize systematic variations in a width of said openings in said first layer.

2. The method of claim 1, said different groups of wafers being associated with different backside roughness level ranges.

3. The method of claim 1, said different groups of wafers comprising at least a low backside roughness level group having relatively shallow pits and a high backside roughness level group having relatively deep pits.

4. The method of claim 3, said etch process being performed using different etch recipes for said different groups, wherein said low backside roughness level group is etched using a first recipe developed to achieve a target dimension at a nominal temperature and wherein said high backside roughness level group is etched using a second recipe developed to achieve said target dimension at a different temperature that is less than said nominal temperature.

5. The method of claim 1, said multiple wafers comprising silicon-on-insulator wafers.

6. The method of claim 1, said multiple wafers being received from multiple different suppliers.

7. A method comprising:
   receiving multiple wafers;
   determining backside roughness levels of said wafers;
   sorting said wafers into different groups of wafers based on said backside roughness levels; and,
   manufacturing integrated circuit chips on said wafers, said manufacturing being performed according to integrated circuit chip design and comprising:
   for each wafer, forming a metal layer on a frontside of said wafer;
   forming a hard mask layer above said metal layer;
   forming a photoresist layer above said metal layer;

forming first openings in said photoresist layer;

performing an etch process to form, in said hard mask layer, second openings aligned below said first openings and separated by hard mask features, said etch process comprising a reactive ion etch process; and, performing an additional process to form, in said metal layer, third openings aligned below said second openings and separated by metal wires aligned below said hard mask features, said reactive ion etch process being performed differently on said different groups of wafers so as to minimize systematic variations in a width of said second openings and, thereby in widths of said hard mask features, said third openings and said metal wires.

8. The method of claim 7, said different groups of wafers being associated with different backside roughness level ranges.

9. The method of claim 7, said different groups of wafers comprising at least a low backside roughness level group having relatively shallow pits and a high backside roughness level group having relatively deep pits.

10. The method of claim 9, said reactive ion etch process being performed using different etch recipes for said different groups of wafers, wherein said low backside roughness level group is etched using a first recipe developed to achieve a target width for said second openings at a nominal temperature, and wherein said high backside roughness level group is etched using a second recipe developed to achieve said target width for said second openings at a different temperature that is less than said nominal temperature.

11. The method of claim 10, said second recipe requiring a greater oxygen flow than said first recipe in order to achieve said target width for said second openings in said high backside roughness level group.

12. The method of claim 7, further comprising, before said forming of said first openings, increasing another target width for said first openings for all of said different groups in order to accommodate adjustments in said reactive ion etch process to achieve said target width for said second openings.

13. The method of claim 7, said multiple wafers comprising silicon-on-insulator wafers.

14. The method of claim 7, said multiple wafers being received from multiple different suppliers.

15. The method of claim 7, said metal layer comprising an aluminum layer and said hard mask layer comprising an oxide layer.

* * * * *